(12) United States Patent
Kim

(10) Patent No.: US 9,418,757 B2
(45) Date of Patent: Aug. 16, 2016

(54) METHOD FOR TESTING SEMICONDUCTOR APPARATUS AND TEST SYSTEM USING THE SAME

(71) Applicant: SK hynix Inc., Icheon-si Gyeonggi-do (KR)

(72) Inventor: Min Chang Kim, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 130 days.

(21) Appl. No.: 14/076,751

(22) Filed: Nov. 11, 2013

(65) Prior Publication Data

US 2015/0043291 A1 Feb. 12, 2015

(30) Foreign Application Priority Data

Aug. 9, 2013 (KR) .................... 10-2013-0094567

(51) Int. Cl.
*G11C 7/00* (2006.01)
*G11C 29/02* (2006.01)
*G11C 29/26* (2006.01)
*G11C 29/50* (2006.01)

(52) U.S. Cl.
CPC ............ *G11C 29/022* (2013.01); *G11C 29/025* (2013.01); *G11C 2029/2602* (2013.01); *G11C 2029/5006* (2013.01)

(58) Field of Classification Search
CPC ............... G11C 29/022; G11C 29/025; G11C 2029/2602; G11C 2029/5006
USPC .................................................. 365/201, 193
See application file for complete search history.

(56) References Cited

U.S. PATENT DOCUMENTS

| | | | |
|---|---|---|---|
| 7,036,055 B2 | 4/2006 | Muljono et al. | |
| 2003/0110457 A1* | 6/2003 | Nadeau-Dostie .. | G01R 31/3012 714/724 |
| 2010/0110807 A1* | 5/2010 | Pious .................... | G11C 29/02 365/194 |
| 2011/0280090 A1* | 11/2011 | Matsubara .................... | 365/193 |
| 2012/0324314 A1* | 12/2012 | Seshadri et al. ............... | 714/773 |

* cited by examiner

*Primary Examiner* — Pho M Luu
*Assistant Examiner* — Mohammed A Bashar
(74) *Attorney, Agent, or Firm* — William Park & Associates Ltd.

(57) ABSTRACT

This technique may include a semiconductor apparatus configured to perform data read/write operations in a test mode or a normal mode and a tester configured to simultaneously perform a data test and a leakage current test through a write operation using data read by a read operation in the normal mode after writing data into the semiconductor apparatus in the test mode.

16 Claims, 5 Drawing Sheets

METHOD FOR TESTING SEMICONDUCTOR APPARATUS AND TEST SYSTEM USING THE SAME

CROSS-REFERENCES TO RELATED APPLICATION

The present application claims priority under 35 U.S.C. §119(a) to Korean application number 10-2013-0094567, filed on Aug. 9, 2013, in the Korean Intellectual Property Office, which is incorporated herein by reference in its entirety.

BACKGROUND

1. Technical Field

Various embodiments relate to a semiconductor apparatus, and more particularly, to a method for testing a semiconductor apparatus and a test system using the same.

2. Related Art

Various tests need to be performed on a semiconductor apparatus in order to verify production characteristics and functions.

One of the various tests includes a test for checking whether or not external data has been correctly written to memory. It is advantageous to perform a test in a cost and time efficient manner.

If a leakage current path is present in an input/output (I/O) pin of a semiconductor apparatus, a leakage current test for determining whether or not a leakage current path is present in the I/O pin is necessary because if a leakage current path is present the reliability of a test for checking whether or not data has been correctly written to memory is significantly low.

In a known art, a leakage current test cannot be performed while performing a data test. As a result, cost and time is increased because the leakage current test needs to be performed in addition to the data test.

SUMMARY

A semiconductor apparatus and a test system using the same, which are capable of reducing cost and time.

An embodiment of the present invention may include performing a write operation on the semiconductor apparatus in a test mode; switching the test mode of the semiconductor apparatus to a normal mode and performing a normal read operation; performing, after a set time, a normal write operation using data read by the normal read operation; and after performing the normal write operation, determining a result of the test by performing a read operation.

An embodiment of the present invention may include a semiconductor apparatus configured to perform data read/write operations in a test mode or a normal mode and a tester configured to simultaneously perform a data test and a leakage current test through a write operation using data read by a read operation in the normal mode after writing data into the semiconductor apparatus in the test mode.

BRIEF DESCRIPTION OF THE DRAWINGS

Features, aspects, and embodiments are described in conjunction with the attached drawings, in which.

DETAILED DESCRIPTION

Hereinafter, a method for testing a semiconductor apparatus and a test system using the same according to the present invention will be described below with reference to the accompanying drawings through example embodiments.

It is advantageous to quickly and cost effectively perform a data test for checking whether or not external data has been correctly written to memory.

To this end, in an embodiment of the present invention, a multi-bit test mode for simultaneously testing multiple bits may be performed.

Figure 1:
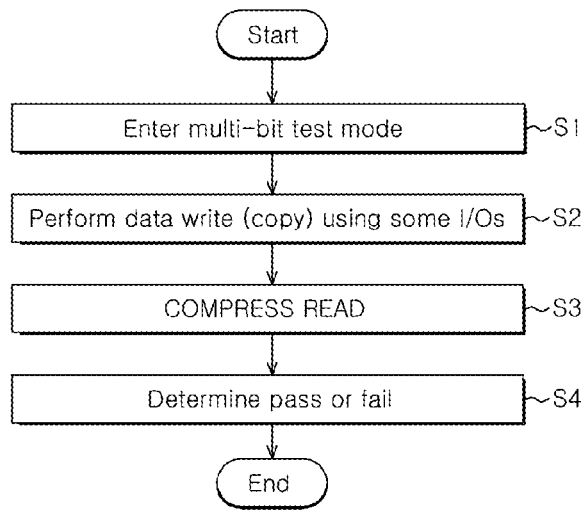
FIG. 1 is a flowchart illustrating a method for testing a semiconductor apparatus in accordance with an embodiment of the present invention.

A method for testing a semiconductor apparatus in accordance with an embodiment of the present invention is described below with reference to FIG. 1.

An external device, for example, a semiconductor apparatus to be tested using a tester can enter a multi-bit test mode at step S1.

When the tester provides a command to the semiconductor apparatus, the semiconductor apparatus may enter multi-bit test mode.

A data write operation can be performed using some of all I/O paths of the semiconductor apparatus (hereinafter simply referred to as 'I/Os') at step S2.

Using data copied from the data of the some I/Os, a data write can be performed on the remaining I/Os other than the some I/Os.

A compress read can be performed at step S3.

The compress read can be an operation for reading all data bits using a determined operation (for example, XOR operation).

The test may be completed by determining a pass or fail based on a value of the data read by the compress read operation at step S4.

A method for testing a semiconductor apparatus in accordance with another embodiment of the present invention is described below with reference to FIG. 2.

A semiconductor apparatus that is to be tested using a tester can enter a multi-bit test mode at step S11.

When the tester provides a command to the semiconductor apparatus, the semiconductor apparatus may enter multi-bit test mode.

A data write operation can be performed using some of all I/O paths of the semiconductor apparatus at step S12.

Using data copied from the data of the some I/Os, a data write can be performed on the remaining I/Os other than the some I/Os.

The operating mode of the semiconductor apparatus can switch to a normal mode in which a normal read operation is performed on all the I/Os at step S13.

After a set time, a normal write operation can be performed using normal read data, that is, data read by the normal read operation, at step S14.

Next, a compress read can be performed at step S15.

The compress read can be an operation for reading all data bits by using a determined operation (for example, XOR operation).

The test can be completed by simultaneously determining a pass or fail and a result of a leakage current test. The pass or fail and the result of the leakage current test may be determined based on a value of the data read by the compress read process at step S16. If the value of the data read by the compress read is not the same as the value of the data stored in the normal read operation, the test has failed and there may be a leakage current path in the pin associated with the read operations. In other words, using the compressed read operation the tester determines with the normal write operation succeeded (i.e., the write operation wrote the same data stored in the normal read).

An I/O pin (hereinafter simply referred to as a 'pin') maintains a value of normal read data for a time corresponding to the I/O pin's own capacitance. The I/O pin may be electrically coupled with an I/O on which a normal read operation is performed.

If a leakage current path is present in the pin, there is a reduction in the time a value of a normal read data remains intact in the pin.

A normal read operation may be performed and after a set time, a normal write operation is performed using normal read data maintained in a pin. If there is a leakage current path present in the pin, after the set time the normal read data maintained in the pin may have changed values. Because the normal read data maintained in the pin may have changed values, the normal write operation may write data into a corresponding memory cell which is different from the originally stored normal read data.

If a leakage current path is not present in the pin electrically coupled with the I/O, a value of the normal read data will remain intact for a time corresponding to the capacitance of the pin.

If the pin does not have a leakage current path, the normal read data remains intact in a pin. If a normal read operation is performed, and after a set time a normal write operation is performed using normal read data maintained in the pin, data having the same value as the normal read data will be written into a corresponding memory cell.

Accordingly, in an embodiment of the present invention, a data test and a leakage current test can be performed at the same time by storing data to a pin using a normal read operation, and after a set time performing a normal write operation using data maintained in the pin by the normal read operation.

A test system 100 for implementing a test method is described below with reference to FIG. 3.

Figure 3:
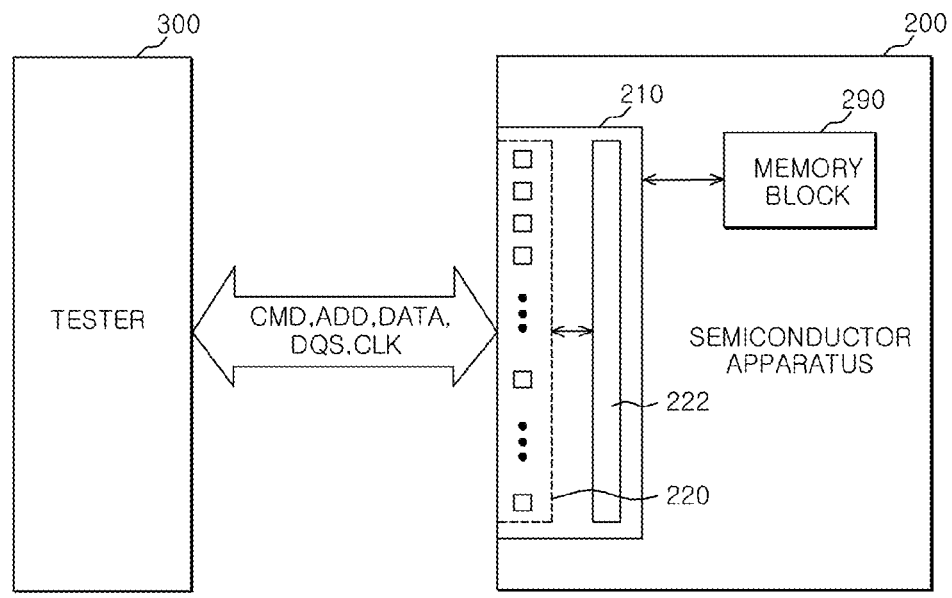
FIG. 3 is a block diagram of a test system in accordance with an embodiment of the present invention.

As shown in FIG. 3, the test system 100 in accordance with an embodiment of the present invention includes a semiconductor apparatus 200 and a tester 300.

The semiconductor apparatus 200 can be configured to perform a data read/write operation in a test mode (for example, a multi-bit test mode) or a normal mode.

The semiconductor apparatus 200 can include an I/O interface block 210 and a memory block 290.

The I/O interface block 210 can include a plurality of pins 220 and an I/O circuit block 222.

Although not shown, the I/O interface block 210 can further include a command decoder and an address decoder.

The plurality of pins can include pins allocated to data, a pin allocated to a data strobe signal DQS, a pin allocated to a data mask signal DM, and a pin allocated to a clock signal CLK.

The I/O circuit block 222 can be electrically coupled with the plurality of pins 220 and can be configured to perform the input and output of data DATA, the data strobe signal DQS, the data mask signal DM, and the clock signal CLK.

The I/O circuit block 222 can include a plurality of I/O circuits and can selectively include I/O circuits 230 to 270, such as those of FIGS. 4 to 9 to be described later.

A signal path, including one of the plurality of pins 220 and one of the plurality of I/O circuits, can be called an I/O path (hereinafter simply referred to as an 'I/O').

Accordingly, the signal paths including the plurality of pins 220 and the plurality of I/O circuits can form a plurality of I/Os.

The pins allocated to data have been illustrated as being electrically coupled with the I/Os. The pins allocated to the data strobe signal DQS and the data mask signal DM typically only require input. Thus, in some examples, pins allocated to the data strobe signal DQS and the data mask signal DM do not have I/Os electrically coupled with the memory block 290.

Accordingly, in accordance with an embodiment of the present invention, the plurality of I/O circuits can be configured to provide signal paths for a leakage current test using the pins allocated to the data strobe signal DQS and the data mask signal DM in a test mode.

The memory block 290 is electrically coupled with the I/O interface block 210. Data write and data read operations are performed on the memory block 290.

Although not shown, the semiconductor apparatus 200 can further include a delay-locked loop or a phase-locked loop.

The tester 300 can be configured to simultaneously perform a data test and a leakage current test through a write operation using data read by a read operation in a normal mode. The read operation is in the normal mode may be performed after data is written into the semiconductor apparatus 200 in a test mode. The data test and the leakage current test may further comprise comparing data read by the read operation with data written into the memory block 290.

The tester 300 can supply the semiconductor apparatus 200 with a command CMD, an address ADD, a data strobe signal DQS, and a clock signal CLK which are necessary for a test mode.

In response to the command CMD from the tester 300, the semiconductor apparatus 200 can enter a test mode or a normal mode.

The tester 300 can instruct the semiconductor apparatus 200 to perform a data write operation. The data write operation may be performed on some of all the I/Os, using the command CMD or the command CMD and the address ADD.

The tester 300 can control the timing of various commands by controlling the timing of the command CMD.

A construction of the I/O circuit 230 of the I/O circuit block 222 which is electrically coupled with pins allocated to data is described with reference to FIG. 4.

Figure 4:
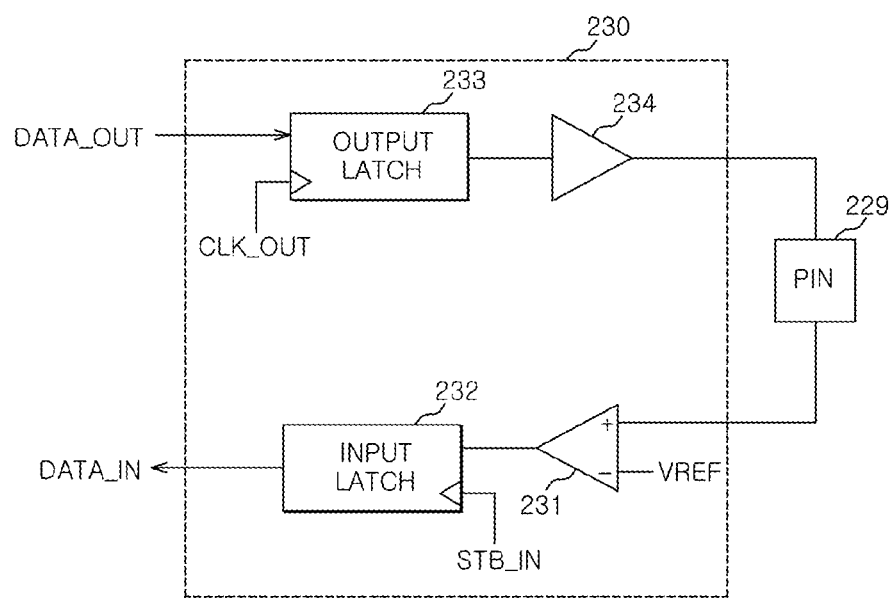
FIG. 4 is a block diagram of an I/O circuit 230 included in an I/O circuit block 222 of FIG. 3.

As shown in FIG. 4, the I/O circuit 230 can include an input buffer 231, an input latch 232, an output latch 233, and an output driver 234.

The input buffer 231 can buffer a signal that is data applied to a pin 229 in response to a reference voltage VREF.

The input latch 232 can latch the output of the input buffer 231 as write data DATA_IN in response to an input strobe signal STB_IN.

The output latch 233 can latch read data DATA_OUT in response to an output clock signal CLK_OUT.

Here, a clock signal delayed and locked by the delay-locked loop or a clock signal phase-locked by the phase-locked loop can be used as the output clock signal CLK_OUT.

The output driver 234 drives the output signal of the output latch 233 and applies the driven signal to the pin 229.

At this time, the pin 229 of the semiconductor apparatus 200 can maintain a value of data applied to the pin 229 for a time corresponding to the pin's 229 own capacitance due to the capacitance.

If a leakage current path is present in the pin 229, there is a reduction in the time that a value of the data remains in the pin 229.

When there is a leakage current path present in the pin 229, if a normal read operation is performed, and after a set time a normal write operation is performed using normal read data maintained in the pin 229, data having a different value from the normal read data will be written into a corresponding memory cell of the memory block 290.

If a leakage current path is not present in the pin 229, a value of the normal read data will remain intact for a time corresponding to the capacitance of the pin 229.

Where the pin 229 does not have a leakage current path if a normal read operation is performed, and after a set time a normal write operation is performed using normal read data maintained in the pin 229, data having the same value as the normal read data will be written into a corresponding memory cell of the memory block 290.

Figure 2:
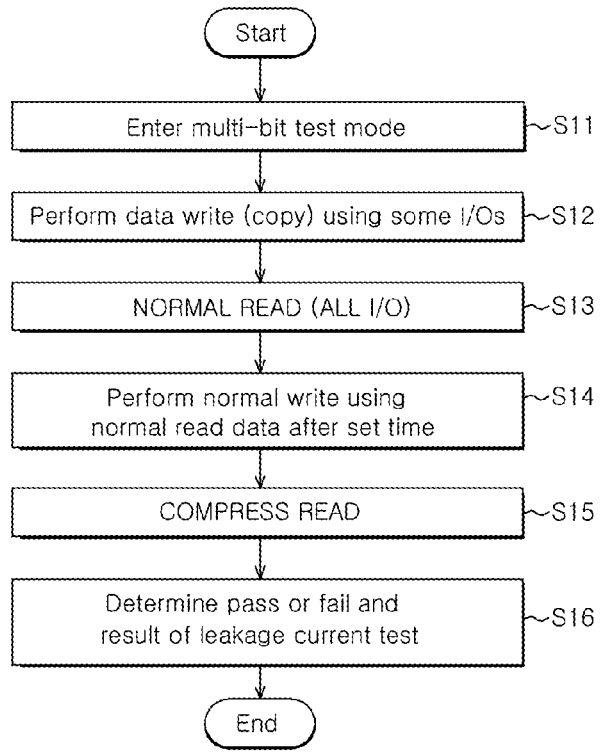
FIG. 2 is a flowchart illustrating a method for testing a semiconductor apparatus in accordance with another embodiment of the present invention.

Accordingly, the tester 300 can simultaneously perform a data test and a leakage current test by performing a normal read operation during a test mode process, such as that of FIG. 2. After a set time, normal write operation may be performed. The normal write operation may use data maintained in a pin using the normal read operation.

The construction of an I/O circuit 240 of the I/O circuit block 222 which is electrically coupled with a pin 239 allocated to data is described below with reference to FIG. 5.

The I/O circuit 240 is configured to improve the accuracy of a leakage current test using the capacitance of the pin.

Figure 5:
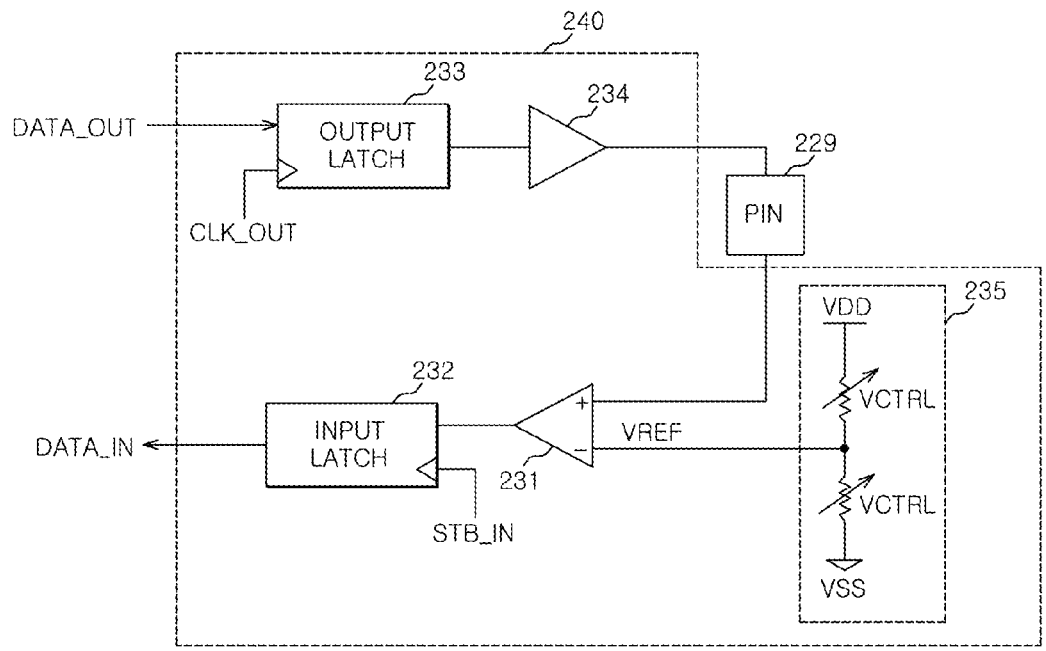
FIG. 5 is a block diagram of an I/O circuit 240 included in the I/O circuit block 222 of FIG. 3.

As shown in FIG. 5, the I/O circuit 230 can include an input buffer 231, an input latch 232, an output latch 233, an output driver 234, and a reference voltage change unit 235.

The input buffer 231 can buffer a signal that is data applied to the pin 239 in response to a reference voltage VREF.

The input latch 232 can latch the output of the input buffer 231 as write data DATA_IN in response to an input strobe signal STB_IN.

The output latch 233 can latch read data DATA_OUT in response to an output clock signal CLK_OUT.

Here, a clock signal delayed and locked by the delay-locked loop or a clock signal phase-locked by the phase-locked loop can be used as the output clock signal CLK_OUT.

The output driver 234 can drive the output signal of the output latch 233 and apply the driven signal to the pin 229.

The reference voltage change unit 235 can be configured to change a reference voltage VREF in response to a control signal VCTRL.

A value stored in the semiconductor apparatus 200 can be used as the control signal VCTRL, or the control signal VCTRL can be changed in response to the command CMD from the tester 300.

The reference voltage change unit 235 can include division resistors electrically coupled with a power source terminal VDD and a ground terminal VSS. The reference voltages VREF can be changed by controlling a resistance ratio of the division resistors in response to the control signal VCTRL.

A pin may have a different leakage current characteristic and different capacitance due to power, voltage or/and temperature (PVT) shifts.

Accordingly, a leakage current test can be performed more accurately by controlling the reference voltage VREF through the reference voltage change unit 235.

The I/O circuit 230 of FIG. 4 or the I/O circuit 240 of FIG. 5 can be used with some of or all the plurality of pins of the is semiconductor apparatus 200.

For example, the I/O circuit 240 of FIG. 5 can be electrically coupled with some I/Os used in a test, and the I/O circuit 230 of FIG. 4 can be electrically coupled with the remaining I/Os.

All I/Os may be electrically coupled with any one of the I/O circuit 230 of FIG. 4 and/or the I/O circuit 240 of FIG. 5.

Typically, the pins allocated to data have been illustrated as being electrically coupled with the I/Os. The pin allocated to the data strobe signal DQS and the data mask signal DM requires only input. Thus, in some examples, pins allocated to the data strobe signal DQS and the data mask signal DM do not have I/Os electrically coupled with the memory block 290.

Accordingly, embodiments of the present invention in which a leakage current test can be performed on the pins allocated to the data strobe signal DQS and the data mask signal DM in a test mode is described below.

A construction of an I/O circuit 250 configured to perform a test on the pins allocated to the data strobe signal DQS and the data mask signal DM is described below with reference to FIGS. 6 and 7.

Figure 6:
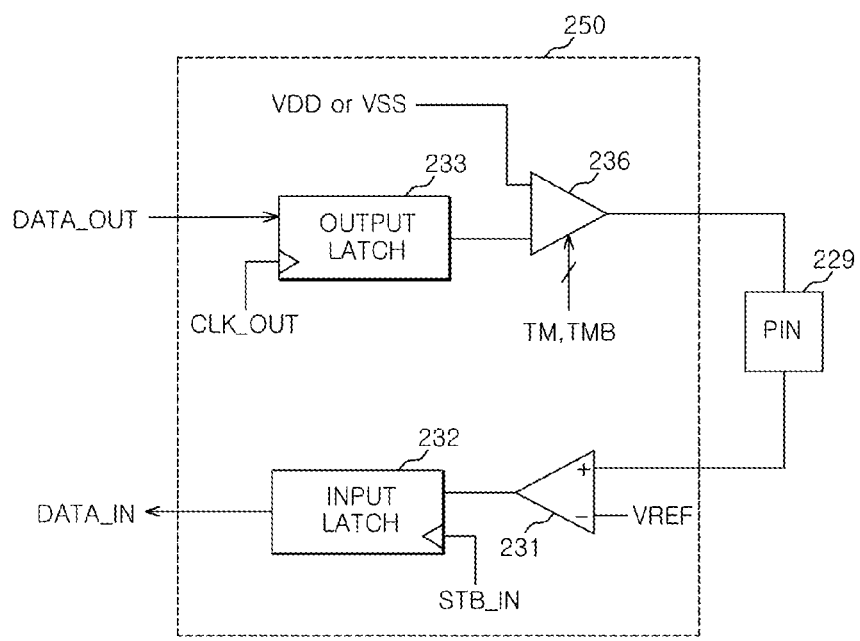
FIG. 6 is a block diagram of an I/O circuit 250 included in the I/O circuit block 222 of FIG. 3.

As shown in FIG. 6, the I/O circuit 250 can include an input buffer 231, an input latch 232, an output latch 233, and an output driver 236.

The input buffer 231 buffers a signal that is data applied to the pin 239 in response to a reference voltage VREF.

The input latch 232 latches the output of the input buffer 231 as write data DATA_IN in response to an input strobe signal STB_IN.

The output latch 233 can latch read data DATA_OUT in response to an output clock signal CLK_OUT.

Here, a clock signal delayed and locked by the delay-locked loop or a clock signal phase-locked by the phase-locked loop can be used as the output clock signal CLK_OUT.

The output driver 236 drives a level signal VDD or VSS or the output signal of the output latch 233 and the output driver 236 applies the driven signal to the pin in response to test mode signals TM and TMB.

The test mode signals TM and TMB can be activated while the semiconductor apparatus 200 enters a test mode in response to the command CMD from the tester 300 and the test mode signals TM and TMB can be internally generated within the semiconductor apparatus 200 in response to the command CMD of the tester 300.

The level signal VDD or VSS is a signal that may be substituted for the data strobe signal DQS or the data mask signal DM during a test.

Figure 7:
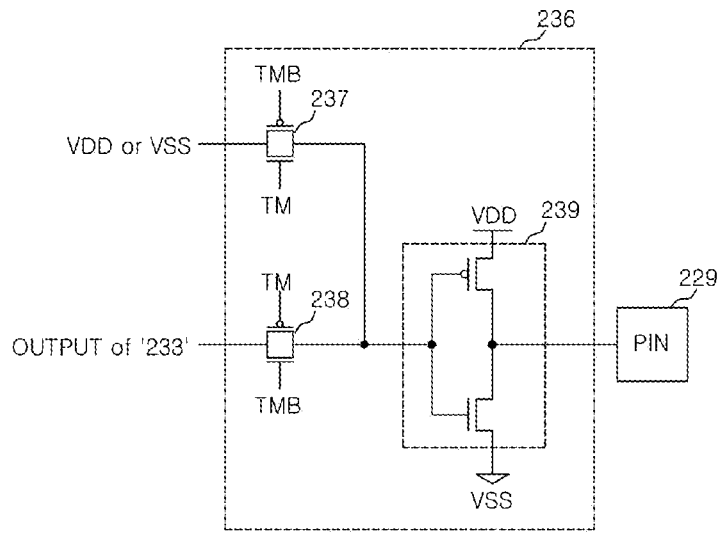
FIG. 7 is a circuit diagram of an output driver 236 of FIG. 6.

As shown in FIG. 7, the output driver 236 of FIG. 6 can include a plurality of switches 237 and 238 and a driver 239.

When the test mode signals TM and TMB are activated, that is, when the semiconductor apparatus 200 enters a test mode, the level signal VDD or VSS passing through the switch 237 can be driven through the driver 239 and then supplied to the pin 229.

When the test mode signals TM and TMB are deactivated, that is, when the semiconductor apparatus 200 enters a normal mode, output signal of the output latch 233 passing through the switch 238 can be driven through the driver 239 and then supplied to the pin 229.

In accordance with the embodiments of FIGS. 6 and 7, a data write can be autonomously performed even without an external data write operation. Accordingly, even though steps S12 and S13 are omitted from the test process of FIG. 2, a data test and a leakage current test can be performed on both the pins allocated to the data strobe signal DQS and the data mask signal DM and the pins allocated to data.

Constructions of I/O circuits 260 and 270 configured to perform a test on the pins allocated to the data strobe signal DQS and the data mask signal DM are described below with reference to FIGS. 8 and 9.

The pins allocated to the data strobe signal DQS and the data mask signal DM cannot be tested without a data line because they are not electrically coupled with the memory block 290. For this reason, in an embodiment of the present invention, when the semiconductor apparatus 200 is in the test mode, the signals of the pins allocated to the data strobe signal DQS and the data mask signal DM are replaced by one of the signals of normal data lines.

Figure 8:
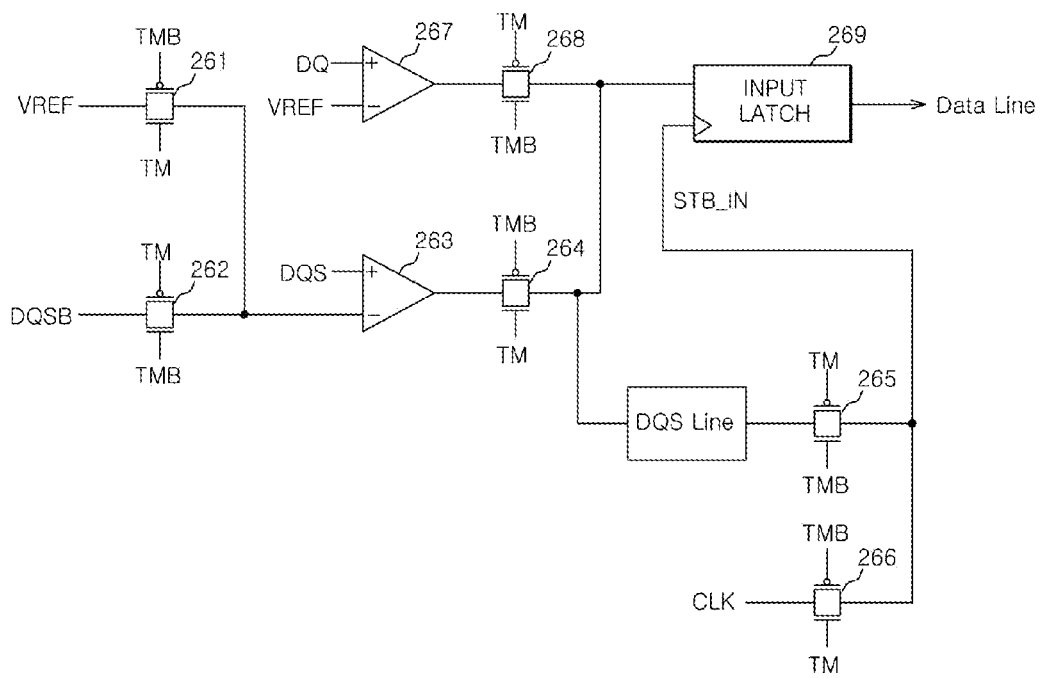
FIG. 8 is a block diagram of an I/O circuit 260 included in the I/O circuit block 222 of FIG. 3.

As shown in FIG. 8, the I/O circuit 260 configured to replace the signal of the pin allocated to the data strobe signal DQS with that of one of normal data lines can include a plurality of switches 261, 262, 264, 265, 266, and 268, a plurality of buffers 263 and 267, and an input latch 269.

When test mode signals TM are TMB are activated, the data strobe signal DQS can be supplied to the data line through the input latch 269 via the buffer 263 and the switch 264.

The data strobe signal DQS applied to the data line is data and can be written into a corresponding memory cell of the memory block 290.

Here, the clock signal CLK can be inputted to the input latch 269 as an input strobe signal STB_IN through the switch 266 because the data strobe signal DQS is not toggled in a test mode.

Furthermore, the data strobe signal DQS can be applied to the data line in a differential signal form, that is, a DQS or DQSB form.

Accordingly, when the test mode signals TM and TMB are activated, a reference voltage VREF can be applied to the buffer 263 through the switch 261 instead of DQSB.

When the test mode signals TM and TMB are deactivated, the data strobe signal DQS is normally inputted to the input latch 269 as the input strobe signal STB_IN via the switch 265 and a DQS line.

Figure 9:
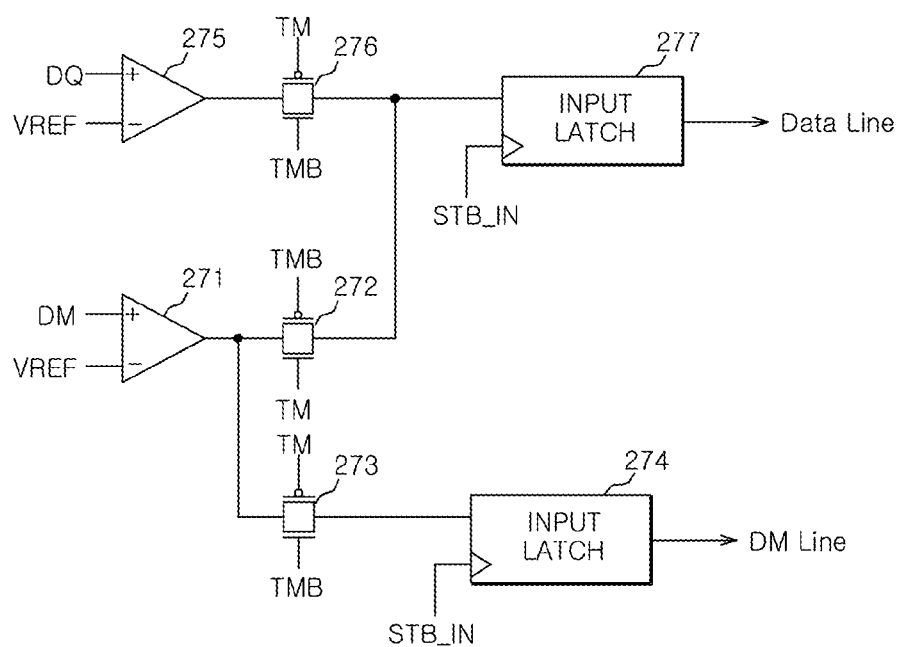
FIG. 9 is a block diagram of an I/O circuit 270 included in the I/O circuit block 222 of FIG. 3.

As shown in FIG. 9, the I/O circuit 270 configured to replace the signal of the pin allocated to the data mask signal DM with one of the signals of normal data lines can include a plurality of buffers 271 and 275, a plurality of switches 272, 273, and 276, and a plurality of input latches 274 and 277.

When test mode signals TM and TMB are activated, the data mask signal DM can be supplied to the data line through the input latch 277 via the buffer 271 and the switch 272.

The data mask signal DM applied to the data line is data and can be written into a corresponding memory cell of the memory block 290.

When the test mode signals TM and TMB are deactivated, the data mask signal DM can be supplied to a data mask signal line DM Line through the input latch 274 via the buffer 271 and the switch 273.

Typically, pins allocated to the data strobe signal DQS and the data mask signal DM do not have I/Os electrically coupled with the memory block 290. In one embodiment, however, in a test mode, the pins allocated to the data strobe signal DQS and the data mask signal DM may be electrically coupled with the memory block 290 using a normal data line. Accordingly, as described above with reference to FIGS. 8 and 9, values stored at the pins allocated to the data strobe signal DQS and the data mask signal DM can be written into the memory block 290 in a data form because a normal data line is electrically coupled with these pins. In other words, in some embodiments, in the test mode, I/Os may be configured to apply a level signal VDD or VSS that replaces the data strobe signal DQS or a level signal VDD or VSS that replaces the data mask signal DM to a pin coupled with at an I/O.

In accordance with this technique, cost and time taken to perform a test on a semiconductor apparatus can be reduced.

While certain embodiments have been described above, it will be understood by those skilled in the art that the embodiments described are by way of example only. Accordingly, the method and the test system using the same described herein should not be limited based on the described embodiments. Rather, the method and the test system described herein should only be limited in light of the claims that follow when taken in conjunction with the above description and accompanying drawings.

What is claimed is:

1. A method for testing a semiconductor apparatus, comprising:
    performing a normal read operation by reading a data from the semiconductor apparatus;
    performing a normal write operation by writing a level of a signal which is maintained in an I/O pin by the normal read operation; and
    determining a result of a leakage current test of the I/O pin by performing a read operation, after the normal write operation.

2. The method according to claim 1, further comprises:
    performing a write operation on the semiconductor apparatus in a test mode before the normal read operation.

3. The method according to claim 1, the I/O pin is allocated to a data strobe signal DQS or a data mask signal DM.

4. A test system, comprising:
    a semiconductor apparatus comprises a plurality of pins, and a memory block electrically coupled with the plurality of pins, and configured to perform a leakage current test by writing a level of a signal which is maintained in any one of the plurality of pins by a previous read operation to the memory block; and
    a tester configured to determine a result of the leakage current test according to a data output from the memory block.

5. The test system according to claim 4, wherein the data output from the memory block is corresponds to the any one of the plurality of pins.

6. The test system according to claim 4, further comprises:
    a plurality of I/O circuits electrically coupled between the plurality of pins and the memory block.

7. The test system according to claim 6, wherein each of the plurality of I/O circuits comprises:
    an input buffer configured to buffer a signal applied to the any one of the plurality of pins,
    an input latch configured to latch an output of the input buffer,
    an output latch configured to latch a read data, and
    an output driver configured to drive an output signal of the output latch and apply the driven signal to the any one of the plurality of pins.

8. The test system according to claim 6, wherein each of the plurality of I/O circuits comprises:
   an input buffer configured to buffer a signal applied to the any one of the plurality of pins, according to a reference voltage,
   an input latch configured to latch an output of the input buffer,
   an output latch configured to latch a read data,
   an output driver configured to drive an output signal of the output latch and apply the driven signal to the any one of the plurality of pins, and
   a reference voltage change unit configured to change the reference voltage in response to a control signal.

9. The test system according to claim 4, wherein the plurality of pins comprises pins allocated to data, a pin allocated to a data strobe signal, and a pin allocated to a data mask signal.

10. The test system according to claim 9, wherein each of the plurality of I/O circuits is configured to apply a level signal that replaces the data strobe signal or a level signal that replaces the data mask signal to a pin electrically coupled with each I/O circuit in a test mode.

11. The test system according to claim 9, wherein each of the plurality of I/O circuits comprises:
   an input buffer configured to buffer a signal applied to a pin electrically coupled with the input buffer, from among the plurality of pins, in response to a reference voltage,
   an input latch configured to latch output of the input buffer as write data,
   an output latch configured to latch read data, and
   an output driver configured to drive a level signal or an output signal of the output latch and apply the driven signal or the output signal to the pin electrically coupled with the input buffer in response to a test mode signal.

12. The test system according to claim 9, wherein each of the plurality of I/O circuits is configured to write the data strobe signal or the data mask signal into the memory block through a predetermined data line in a test mode.

13. The test system according to claim 9, wherein each of the plurality of I/O circuits comprises:
   a buffer configured to buffer and output the data strobe signal,
   an input latch electrically coupled with a data line, and
   a first switch configured to transfer output of the buffer to the input latch in response to a test mode signal.

14. The test system according to claim 13, wherein the input latch is configured to transfer an input signal to the data line in response to an input strobe signal.

15. The test system according to claim 14, further comprising:
   a second switch configured to transfer a clock signal to the input latch as the input strobe signal in response to an activation of the test mode signal, and
   a third switch configured to transfer the data strobe signal to the input latch as the input strobe signal in response to a deactivation of the test mode signal.

16. The test system according to claim 9, wherein each of the plurality of I/O circuits comprises:
   a buffer configured to buffer and output the data mask signal,
   an input latch electrically coupled with a data line, and
   a switch configured to transfer output of the buffer to the input latch in response to a test mode signal.

* * * * *